Aug. 28, 1962 E. S. SEELEY 3,051,788

AMPLIFIER INTERCONNECTING CIRCUIT

Filed May 12, 1961

EDWARD S. SEELEY
INVENTOR.

BY Lyon & Lyon

ATTORNEYS

United States Patent Office 3,051,788

Patented Aug. 28, 1962

3,051,788
AMPLIFIER INTERCONNECTING CIRCUIT

Edward S. Seeley, Santa Ana, Calif., assignor to Altec Lansing Corporation, Anaheim, Calif., a corporation of Delaware Filed May 12, 1961, Ser. No. 109,734
6 Claims. (Cl. 179—1)

This invention relates to circuit arrangements for connecting apparatus in parallel to provide fail-safe operation and, more particularly, to improvements therein.

The failure of power amplifiers in public-address systems caused by blowing of a fuse in the amplifier or by a tube failure is probably the most common cause of system failures. To improve reliability of such systems, the practice has long been followed of connecting power amplifiers in parallel, both at the input and the output terminals, in order that failure of one amplifier might leave the companion amplifier to carry at least part of the load. The trouble with this system is that failures sometimes occur of a kind that results in effectively short-circuiting the output of the surviving amplifier.

This difficulty is aggravated when negative-feedback amplifiers are connected in parallel. Amplifiers of this type which are designed for public-address use, usually present an internal impedance at the output circuit of between ten and twenty percent of the impedance of the load. If one amplifier in a parallel-connected pair develops a reduction of gain due to a partial impairment of a tube, or from other cause, that amplifier then becomes a parasitic load on the remaining normal amplifier, this load having a much lower impedance than the intended normal load of the combined amplifiers. Because of design factors aimed at obtaining the most efficient service, the operation of an amplifier of this type with a load impedance which is substantially lower than the rated load impedance can cause excessive temperatures to develop within the tubes in the amplifier to the detriment of the amplifier.

When two feedback amplifiers, connected to work in parallel into a common load, are perfectly balanced, the operation of each is unaffected by the other. If one of the pair has lower gain than the other, it tends to deliver a lower output voltage, and the normal amplifier of the pair drives the weaker one along with the load. As previously noted, a feed-back amplifier normally has an output impedance that is very much lower than its nominal load. These several facts combine to establish the condition that a reduction of as little as twenty percent in the output voltage of one amplifier may cause the other to take over the entire load, and, in addition, to drive audio power into the output circuit of the weaker amplifier. The normal amplifier, under these circumstances, is working into a load impedance that is much lower than optimal or normal, and the consequences of such operation are as previously indicated, namely, to cause excessive tube heating, possible fuse operation and detriment of the amplifier, leading to early failure.

An object of this invention is to provide an arrangement for interconnecting apparatus such as amplifiers to a load in a manner so that upon the failure of one of the amplifiers the other amplifier can feed the load independently of the amplifier that has failed.

Another object of this invention is the provision of an arrangement for interconnecting amplifiers to a common load, which enables either amplifier to feed the load upon the failure of the other amplifier without any adverse effects thereon.

Yet another object of the present invention is the provision of a novel, useful, and efficient circuit arrangement for effectuating fail-safe operation of the apparatus.

These and other objects of the invention may be achieved in an arrangement for feeding a load with two amplifiers, by way of example, where there is interposed between the amplifiers and the load a network including a center-tapped winding across which a resistor is connected, having a resistance value four times that of the load. The center-tapped winding and resistor are connected across two of the output terminals of the amplifiers; the other two output terminals are connected together and to one side of the load. The other side of the load is connected to the center-tapped winding. As will be shown subsequently herein, with such an arrangement the load which the amplifiers see is the same, regardless of the cause of the failure which can occur to one or the other of the amplifiers.

The novel features that are considered characteristic of this invention are set forth with particularity in the appended claims. The invention itself, both as to its organization and method of operation, as well as additional objects and advantages thereof, will best be understood from the following description when read in connection with the accompanying drawings, in which:

Figure 1:
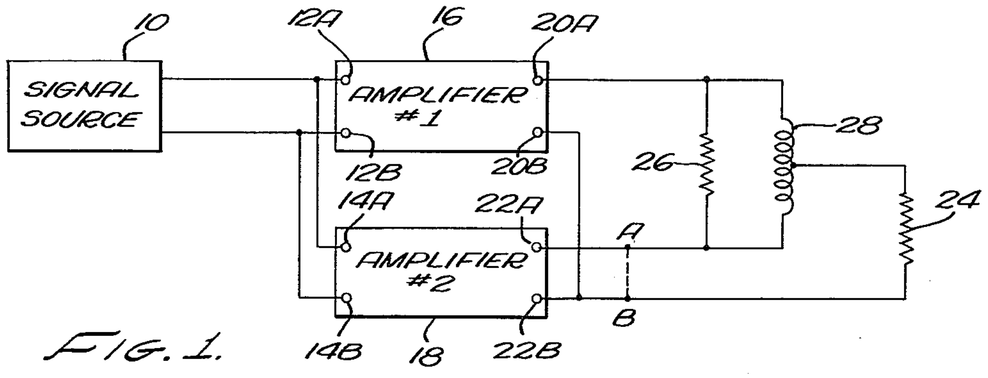
FIGURE 1 is a circuit diagram of an embodiment of the invention.

Reference is now made to FIGURE 1, which shows a circuit diagram of an arrangement for interconnecting two amplifiers in accordance with this invention for feeding a common load in a manner so that the impedance which either of the amplifiers will see upon the failure of the other amplifier remains the same. A signal source 10 applies signals to the terminals 12A, 12B and 14A, 14B of two amplifiers, respectively 16, 18. Connection to the inputs to these two amplifiers is in parallel fashion, which is conventional.

In accordance with this invention, the common output terminals 20B, 22B of the two amplifiers are connected together and to one side of the load 24, which here is represented by a resistor. A resistor 26 connects the other two output terminals, respectively 20A, 22A. In parallel with the resistor 26 there is connected a center-tapped winding 28, which preferably is an autotransformer winding of high efficiency. The center tap of the winding 28 is connected to the other end of the load 24.

If the amplifiers are identical in gain and phase, the voltages at the output will be identical and, therefore, there will be no voltage difference between terminals 20A and 22A. As a consequence, no current flows through resistor 26 and no power is developed in this resistor. Further, the currents that flow from output terminal 20A to the load resistor 24 and from output terminal 22A to the load resistor 24 pass through the winding 28 in opposite directions, so that their induced voltages are canceled. Hence, no voltage drop occurs across the winding 28, except for a small drop due to the winding resistance, and this may be effectively negligible if the winding 28 has high efficiency. Thus, under the conditions of perfect balance of the two amplifiers, no losses occur in the coupling network, and the amplifiers perform as though terminals 20A and 22A were connected together and to one side of the load resistance 24.

Under the conditions designated, each amplifier works into a load having a value of twice the resistance of the load 24. This may be designated as $2R_L$. As an explanation of this, consider that the amplifier outputs are independent and are each connected to separate loads of value, which is designated as $2R_L$. If gains and phases are identical, the voltages across the two loads are identical. They may then be connected in parallel without any change occurring. Clearly, two resistors each of value $2R_L$, connected in parallel, is equivalent to a single resistor of value $2R_L$.

The value for resistor 26 should be selected as four times that of resistor 24, or equal to $4R_L$. In order to explain what happens when the amplifiers are unbalanced, two extreme cases of unbalance will be discussed. One extreme case of unbalance occurs when a failure in one of the amplifiers occurs of the type that is equivalent to an open circuit in its output. This can occur if an output tube is not operating and is not shorted. The effect achieved is the same as if the connection between the terminal 22A and one end of the resistor 26 and winding 28 is open, for example, at the point designated by the letter A in the diagram. In such event, the other end of the winding 28 and resistor 26 remains connected to the terminal 20A, and the terminal 20B remains directly connected to the load 24. The impedance of the resistor 26 as it appears between one end and center tap of winding 28 will be equal to one-fourth of the resistance value, or equal to the value $R_L$. As a result, the surviving amplifier 16 will work into a total load impedance of $2R_L$, which is precisely the value of the load impedance into which each amplifier operates under normal conditions. Therefore, the load condition for the surviving amplifier is not changed when the other amplifier becomes open-circuited.

Assume, now, that a failure has occurred in a manner so that the output of amplifier 18 is shorted. This represents the other type of unbalance which may occur, and in the drawing can be simulated if it is assumed that there is a connection between the points A and B on the diagram. A short circuit can occur in an output tube of an amplifier or in the output transformers, and it would be closely approximated by a failure in the amplifier which prevents the signal from reaching the output circuit. With a short circuit, resistor 26 and winding 28 are effectively directly connected across amplifier 16. The impedance into which amplifier 16 delivers power will be the parallel combination of two elements, the first being resistor 26 and the second being the load impedance $R_L$, as converted through the transformer ratio, which is four to one. This combination of impedances is precisely twice $R_L$, and this again is the impedance into which each amplifier individually delivered its power when there was no unbalance.

Should the gain of one amplifier fall below the gain of the other and the output voltages therefore become out of balance, the unaffected amplifier will continue to work into the same load as it faces when they are in balance. Thus, no kind of impairment can develop in the output of one of the amplifiers that affects the load impedance seen by the remaining unaffected or unimpaired amplifier. For adjusting any unbalance or for achieving amplifier balance, an indicating device, such as a voltmeter or a headset, may be connected across the resistor 26 and the gain controls of the amplifiers may be adjusted until the signal which is heard disappears. This test may be made while the equipment is in normal operation, carrying music or paging announcements or other program. No special oscillator signal is required for the test and adjustment, and the amplifiers need not be removed from service to check the condition of balance.

When one amplifier of a pair is completely out of service due to any cause, it was pointed out that the resistor 26 absorbs the same amount of power as the load 24, whereas when balance exists all power reaches $R_L$. When one amplifier fails, the total power is halved; this is equally divided between the resistor 26 and load 24. Hence, the load power drops to twenty-five percent of normal. The load is normally a set of loudspeakers, and reduction of power to twenty-five percent reduces the operating volume by 6 db. Such volume changes are noticeable, but do not seriously interfere with intelligibility of speech reproduction, unless a high ambient noise-level prevails. To insure that the failure is detected as rapidly as possible, a circuit arrangement may be provided in the manner shown in FIGURE 2.

Figure 2:
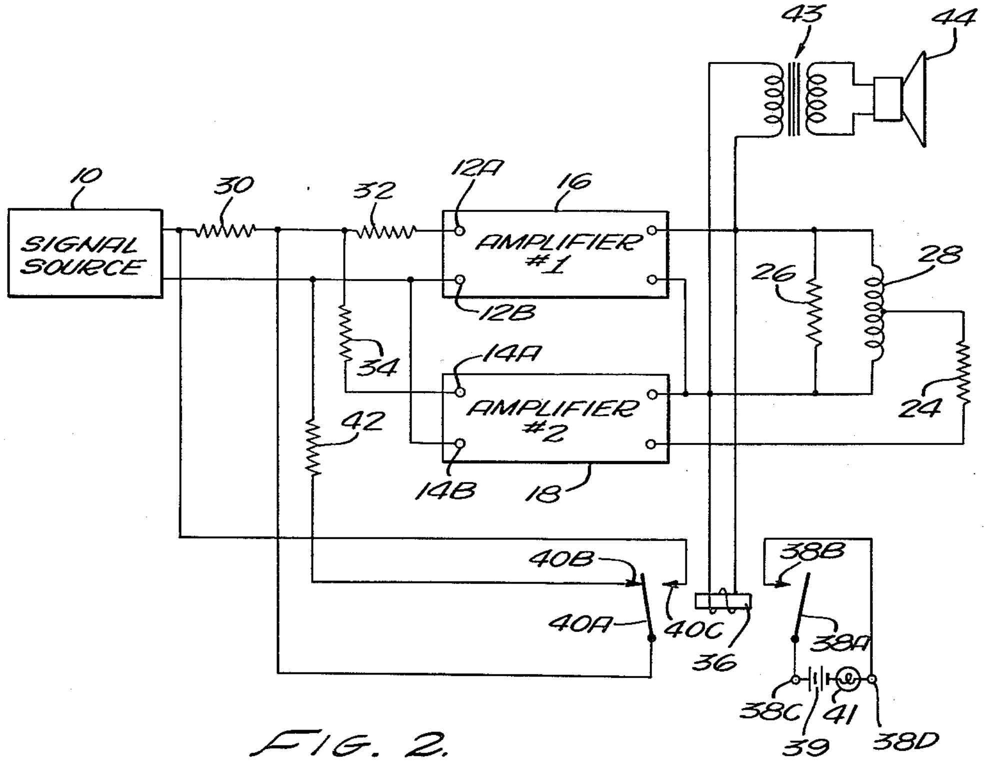
FIGURE 2 is a circuit diagram showing additional features which may be included with the embodiment of the invention, if desired.

In the circuit shown in FIGURE 2, the basic interconnections of the outputs of the amplifiers 16, 18 to the load 24 is identical to that shown in FIGURE 1. However, between the signal source 10 and the parallel-connected inputs to the amplifiers, there is provided in accordance with this arrangement a resistor 30, which is connected in series with the resistor 32. The series-connected resistors 30, 32 serve to connect the signal source 10 to the input terminal 12A of amplifier 16; input terminal 12B is directly connected to the other output of the signal source, as is the input terminal 14B of the amplifier 18. Between the junction of the resistors 30, 32 and input terminal 14A, another resistor 34 is connected. A relay 36 has one normally open contact pair, respectively 38A, 38B, and a double-pole, single-throw contact pair, with the contact swinger 40A being normally closed to contact 40B and contact 40C being the normally open contact. The swinger 40A is connected to the junction between resistors 30, 32; the contact 40B is connected through a resistor 42 to the input to the common terminal 12B, 14B; and the contact 40C is connected to the end of resistor 30, which is connected to the signal source.

The winding, or coil, of the relay 36 is connected across the resistor 26. Also connected to these two points is a primary of an output transformer 42, which has a loudspeaker 44 connected to its secondary winding.

If any substantial unbalance occurs between the two amplifiers 16 and 18, the loudspeaker 44, normally silent, will reproduce the program, and, by locating it at a suitable area, it will be heard by any designated personnel who can instantly report what has happened. Alternatively, detection may be made more positive and more rapid through the use of the relay 36, which is selected to be sufficiently sensitive, and can operate on an unbalanced signal as soon as program signals reach the output of the surviving amplifier. The output terminals 38C and 38D of the normally open contacts 38A, 38B of this relay may be connected to a source of power 39 in series with any alarm device desired, such as a warning light 41. Relay circuits also may be added to provide a lockup feature such that after the first operation of the relay 36, a warning light is operated and will remain operated until a reset switch is operated after the amplifier failure has been corrected.

Relay 36 may be employed to perform the additional function of maintaining the output level of the signal applied to the load 24, despite the failure or unbalance of signals. Regarding FIGURE 2, it will be seen that the resistors 30 and 42 establish an L pad between the signal source 10 and the amplifier 16. This L pad attenuates the signal from the signal source by 6 db. When the relay 36 is operated, due to an unbalance, the L pad effectively is removed from the circuit, since the swinger 40A and contact 40C short out the resistor 30, and the resistor 42 is removed from the circuit. Accordingly, this compensates for the attenuation of the output signal which is caused by resistor 26 when one of the amplifiers deteriorates to the extent that the relay is operated. Resistors 32 and 34 are protective isolating resistors that insure that a failure in one amplifier that places a short circuit across its input terminals will not eliminate the signal at the input terminals of the other amplifier.

There has accordingly been described and shown hereinabove a novel, useful, and unique circuit arrangement for interconnecting two pieces of equipment for feeding a common load in a manner so that deterioration or failure of one of these pieces of equipment can occur without adversely affecting the other piece of equipment or the service provided to the load.

I claim:

1. In a system of the type wherein a load is supplied with signals from two amplifiers each having a pair of output terminals, said amplifiers being connected to a single input-signal source to insure that said load is supplied with signals from said source despite a failure in either one of said amplifiers, said improvement comprising a connection between one of the two output terminals of each one of said amplifiers and one side of said load, and means connecting the other side of said load to the remaining output terminal of each of said amplifiers, said means comprising a resistive impedance and an inductive impedance connected in parallel and between the remaining output terminals of said two amplifiers, said inductive impedance having a center tap which is connected to the other side of said load.

2. A circuit for connecting two amplifiers to feed a common load from a single signal source for insuring signals being supplied to said load regardless of the deterioration of either one of said amplifiers, each of said amplifiers having a pair of output terminals, said circuit comprising a connection between one of the pair of output terminals of each of said amplifiers and one side of said load, a resistance connected between the remaining ones of said pair of output terminals of each of said amplifiers, said resistance having a value on the order of four times the impedance of said load, a center-tapped winding connected across said resistance, said center tap being connected to the other end of said load.

3. An arrangement for connecting two amplifiers between a common signal source and a common load for insuring that signals will continue to be received by said load despite the failure of one of said amplifiers, each of said amplifiers having a pair of input terminals and a pair of output terminals, said system comprising a direct connection between one of the output terminals in each pair and one end of said load, a resistor connected between the remaining output terminals of said amplifiers, a center-tapped winding connected in parallel with said resistor, a connection between the center tap of said center-tapped winding and the other end of said load, said resistor having a value on the order of four times the impedance of said load, and monitor means connected to the remaining terminal in each of said pair of output terminals of said amplifiers.

4. A circuit as recited in claim 3 wherein said monitor means comprises an output transformer having a primary and secondary winding, and a loudspeaker, said output transformer primary winding being connected across said resistor, and said loudspeaker being connected to said secondary winding.

5. A circuit as recited in claim 3 wherein said monitor means includes a relay having a relay operating coil and relay contact means, said relay operating coil being connected across said resistor, an attenuator connected between said signal source and the input terminals of said two amplifiers, and means for connecting said relay contact means to said attenuator for removing said attenuator from between said signal source and the input terminals of said two amplifiers when said relay operating coil is operated as the result of an unbalance in the outputs of said amplifiers.

6. A circuit as recited in claim 3 wherein said monitor means includes a relay having a relay operating coil and relay contact means, said relay operating coil being connected across said resistor, a source of voltage, a warning device connected in series with said relay contact means, and means connecting said source of voltage and said warning device to said relay contact means for rendering said warning device operative when the relay operating coil is energized.

References Cited in the file of this patent

UNITED STATES PATENTS

| | | |
|---|---|---|
| 1,978,578 | Holst et al. | Oct. 30, 1934 |
| 2,980,766 | Nulton | Apr. 18, 1961 |